(12) United States Patent
Heitmann

(10) Patent No.: US 7,359,605 B2
(45) Date of Patent: Apr. 15, 2008

(54) PHOTONIC CRYSTALS

(75) Inventor: Walter Heitmann, Gross-Bieberau (DE)

(73) Assignee: Deutsche Telekom AG, Bonn (DE)

( * ) Notice: Subject to any disclaimer, the term of this patent is extended or adjusted under 35 U.S.C. 154(b) by 105 days.

(21) Appl. No.: 10/474,073

(22) PCT Filed: Mar. 26, 2002

(86) PCT No.: PCT/EP02/03365

§ 371 (c)(1),
(2), (4) Date: Jan. 22, 2004

(87) PCT Pub. No.: WO02/082135

PCT Pub. Date: Oct. 17, 2002

(65) Prior Publication Data

US 2004/0109657 A1    Jun. 10, 2004

(30) Foreign Application Priority Data

Apr. 3, 2001    (DE) ................... 101 16 500

(51) Int. Cl.
*G02B 6/10* (2006.01)
(52) U.S. Cl. ............. 385/129; 385/130; 385/131; 385/132
(58) Field of Classification Search ............. 385/129, 385/130, 131, 132
See application file for complete search history.

(56) References Cited

U.S. PATENT DOCUMENTS

| | | |
|---|---|---|
| 4,993,032 A | 2/1991 | Bradley |
| 5,303,319 A | 4/1994 | Ford et al. |
| 5,377,285 A | 12/1994 | Podgorski |
| 6,768,256 B1 * | 7/2004 | Fleming et al. ............. 313/501 |
| 2003/0016895 A1 * | 1/2003 | Holm et al. .................. 385/2 |

FOREIGN PATENT DOCUMENTS

JP    07-235700    * 5/1995

OTHER PUBLICATIONS

Koops, H.W.P., "Photonic Crystals Built By Three-Dimensional Additive Lithography Enable Integrated Optics Of High Density," Proceedings Of The SPIE, SPIE, Bellingham, VA, US, vol. 2849, Aug. 5, 1996, pp. 248-256.

Shaffer, J.J. et al., "Effect Of Thermal Cycling On Dimensional Stability Of Zerodur And Ule," Applied Optics, Optical Society Of America, Washington, US, vol. 23, No. 17, Sep. 1, 1984, pp. 2852-2853.

* cited by examiner

*Primary Examiner*—Jennifer Doan
(74) *Attorney, Agent, or Firm*—Kenyon & Kenyon LLP

(57) ABSTRACT

A photonic crystal is a three-dimensional dielectric structure which is opaque to electro-magnetic radiation within a given wavelength irrespective of the direction of incidence. The photonic crystal may include, for instance, a matrix-type arrangement of free-standing dielectric micro-columns or cylinders having small diameters. The micro-columns or cylinders are placed on a substrate whose thermal expansion coefficient between 60° C. and 85° C. is at least 50% lower than the thermal expansion coefficients of quartz glass, enabling the thermal expansion of the substrate to be kept to a minimum even when high temperature variations occur. The distance between the micro-columns supported by the substrate or the microcylinders of the photonic crystal varies only to a small amount. The optical characteristics are essentially more stable than those of photonic crystals with a quartz glass substrate. Glass ceramics or, for example, Zerodur® may be used as a substrate.

10 Claims, 1 Drawing Sheet

PHOTONIC CRYSTALS

FIELD OF THE INVENTION

The present invention relates to photonic crystals.

BACKGROUND INFORMATION

Photonic crystals are generally understood to be three-dimensional dielectric structures which are opaque to electromagnetic radiation within a specific wavelength range, regardless of the direction of incidence. In this context, the wavelength range is substantially determined by the arrangement, form, and size of the structures. One type of photonic crystals is constituted of an evenly spaced, for example, matrix-type, array of free-standing dielectric micro-columns or micro-cylinders having very small diameters and a substantial height relative thereto. For visible and infrared light, typical micro-cylinder diameters are in the range of one hundred to a few hundred nanometers.

To fabricate photonic crystals having micro-cylinders, a substrate is needed to support the micro-cylinders. For this, in available methods, inter alia, fused quartz or silica is mostly used due to the mechanical and chemical stability it offers. In the following, it is understood that "photonic crystals" refer to the three-dimensional structure having micro-columns or micro-cylinders, along with the substrate that supports them.

Because of their unusual properties, photonic crystals may be suited for manufacturing optical components, such as very narrow-band filters, modulable filters, add-drop filters, and integrated optical structures having 90°-deflection. Components of this kind are used in DWDM technology (dense wavelength division multiplexing) for transmitting data in optical waveguides, where electromagnetic radiation of various wavelengths is used as a carrier. At the present time, the channel separation or spacing between simultaneously used, adjacent channels is 0.4 nm, wavelengths in the range of about 1550 nm being used. In the future, to achieve a higher bandwidth for transmissions via optical waveguides, the channel separation may drop to 0.2 nm or less. This requires components whose filter properties are extremely stable, particularly in response to substantial temperature fluctuations.

Under substantial temperature fluctuations, the optical properties of photonic crystals and, thus, in particular, also the transmission wavelength of filters based on photonic crystals can markedly change.

SUMMARY OF THE INVENTION

Exemplary embodiments and/or exemplary methods of the present invention are directed to providing photonic crystals, whose optical properties, in the technically relevant temperature range of between −60° C. and 85° C., are more stable than those of available photonic crystals having a fused quartz substrate.

Exemplary embodiments and/or exemplary methods of the present invention are directed to a photonic crystal having a substrate whose thermal expansion coefficient, within the temperature range of between −60° C. and 85° C., is at least 50% less than the magnitude of the expansion coefficient of fused quartz. For that reason, even under conditions of substantial temperature fluctuations, the thermal expansion of the substrate is kept low; consequently, the pitch of, or spacing between, the photonic crystal's micro-columns, i.e., micro-cylinders, supported by the substrate, also changes very little. For that reason as well, the optical properties of the photonic crystal also change very little, so that the optical properties are substantially more stable than those of photonic crystals having a fused-quartz substrate.

The thermal expansion coefficients of the substrate and/or of the fused quartz may be, for example, linear thermal expansion coefficients.

Exemplary embodiments and/or exemplary methods of the present invention are directed to providing that the magnitude of the thermal expansion coefficient of the substrate within the, e.g., entire, temperature range of between −60° C. and 85° C. is at least 50% less than the magnitude of the thermal expansion coefficient of fused quartz.

Exemplary embodiments and/or exemplary methods of the present invention are directed to providing a substrate whose base is of a glass ceramic, whose thermal expansion coefficient within the temperature range of between −60° C. and 85° C. is less than $5 \times 10^{-7}$/° C.

Exemplary embodiments and/or exemplary methods of the present invention are directed to providing a substrate whose base is of a glass ceramic, whose thermal expansion coefficient within the temperature range of between −60° C. and 85° C. is less than $4 \times 10^{-7}$/° C.

Exemplary embodiments and/or exemplary methods of the present invention are directed to providing a substrate whose base is of a glass ceramic, whose thermal expansion coefficient within the temperature range of between −60° C. and 85° C. is less than $3 \times 10^{-7}$/° C.

Exemplary embodiments and/or exemplary methods of the present invention are directed to providing a substrate whose base is of a glass ceramic, whose thermal expansion coefficient within the temperature range of between −60° C. and 85° C. is less than $2 \times 10^{-7}$/° C.

Exemplary embodiments and/or exemplary methods of the present invention are directed to providing a substrate whose base is of a glass ceramic, whose thermal expansion coefficient within the temperature range of between −60° C. and 85° C. is less than $1 \times 10^{-7}$/° C.

Exemplary embodiments and/or exemplary methods of the present invention are directed to providing a substrate whose base is of a glass ceramic, whose thermal expansion coefficient within the temperature range of between −60° C. and 85° C. is less than $5 \times 10^{-8}$/° C. or less than $2 \times 10^{-8}$/° C. A glass ceramic having an expansion coefficient within these last-mentioned ranges can be expensive to manufacture.

In principle, glass ceramics are composite materials having an amorphous glass phase and crystals intercalated or fused therein. The crystals are produced by ceramization, i.e., controlled devitrification (crystallization), of glasses. They are produced by thermally treating a suitable glass in which crystals are produced as a result. For this, in production, suitable raw material is first melted, rectified, homogenized, and is then formed in a hot state. Following the cooling and annealing of the glass-like or vitreous blank, a temperature treatment is carried out in which the crystallization takes place. During the temperature treatment, crystal nuclei form in the glass, and the crystals subsequently grow on these nuclei in response to a somewhat higher temperature.

Exemplary embodiments and/or exemplary methods of the present invention are directed to providing a glass ceramic containing more than 50% by weight of $SiO_2$. Moreover, it may contain various loading materials, in particular, for example, calcium oxide (CaO), sodium oxide (Na2O) having, in part, larger quantities of boron trioxide (B2O3), aluminum oxide (Al2O3), lead oxide (PbO), magnesium oxide (MgO), barium oxide (BaO) or potassium oxide (K2O). Since there is no need for the substrate to have any special optical properties, the influence the loading materials have on the optical properties may be disregarded when selecting the glass ceramic. Glass ceramics are mechanically and chemically very stable, which is useful for the production of photonic crystals and for their later use.

Exemplary embodiments and/or exemplary methods of the present invention are directed to providing that by properly selecting the substrate material which is based on SiO2, the photonic crystals of the present invention may be produced using all available methods for producing photonic crystals having fused-quartz substrates.

In exemplary embodiments and/or exemplary methods, to produce the photonic crystals in accordance with the present invention, there is no need to completely redevelop a method using, in principle, other types of steps. Instead, in the development, one may build upon an available method.

In exemplary embodiments and/or exemplary methods of the present invention, for example, additive lithography may be used for the manufacturing. This method is explained in greater detail in the SPIE reference, vol. 2849, (1996), p. 248 et seq., the content of this article being incorporated by reference, in its entirety, in the subject matter of the disclosure of this Specification.

In exemplary embodiments and/or exemplary methods of the present invention, the glass ceramic has a glass phase and a crystalline phase distributed therein having a thermal expansion coefficient which, within the temperature range of between −60° C. and 85° C., is less than that of the glass phase. In further exemplary embodiments and/or exemplary methods, a glass ceramic is used whose crystalline phase, at least in parts of the temperature range between −60° C. and 85° C., has a negative thermal expansion coefficient. Since the thermal expansion coefficient of a composite material depends to a great degree, inter alia, on the thermal expansion coefficients of its components, the result can be an especially low thermal expansion coefficient of the glass ceramic.

Exemplary embodiments and/or exemplary methods of the present invention provide that the weight proportion of the crystalline phase also influences the thermal expansion coefficient of the glass ceramic. For that reason, when the thermal expansion coefficient of the crystalline phase is less than that of the glass phase, in particular when it is negative, the proportion of the crystalline phase may be selected to be so high that, within the temperature range of between −60° C. and 85° C., the thermal expansion is especially low. In exemplary embodiments and/or exemplary methods, the weight proportion of the crystalline phase in the glass ceramic is between 60 and 90%. In another exemplary embodiment, the weight proportion of the crystalline phase in the glass ceramic is between 70 and 80%.

In exemplary embodiments and/or exemplary methods of the present invention, to ensure that the thermal expansion in the glass ceramic is approximately equivalent in all locations, in order to substantially avoid thermal stresses, the crystalline phase is distributed substantially homogeneously in the glass ceramic.

In exemplary embodiments and/or exemplary methods of the present invention, the glass ceramic ZERODUR® of the firm Schott (Mainz, Germany) is well-suited for manufacturing the photonic crystals. That particular glass ceramic has a very low thermal expansion coefficient of less than $10^{-7}/° C.=0.1$ per million/° C. within the temperature range of between −60° C. and 85° C. and a very homogeneous and fine distribution of the crystalline phase. These properties can facilitate the processing of the substrate and make attainable excellent properties of the same.

BRIEF DESCRIPTION OF THE INVENTION

DETAILED DESCRIPTION OF THE INVENTION

Figure 1:
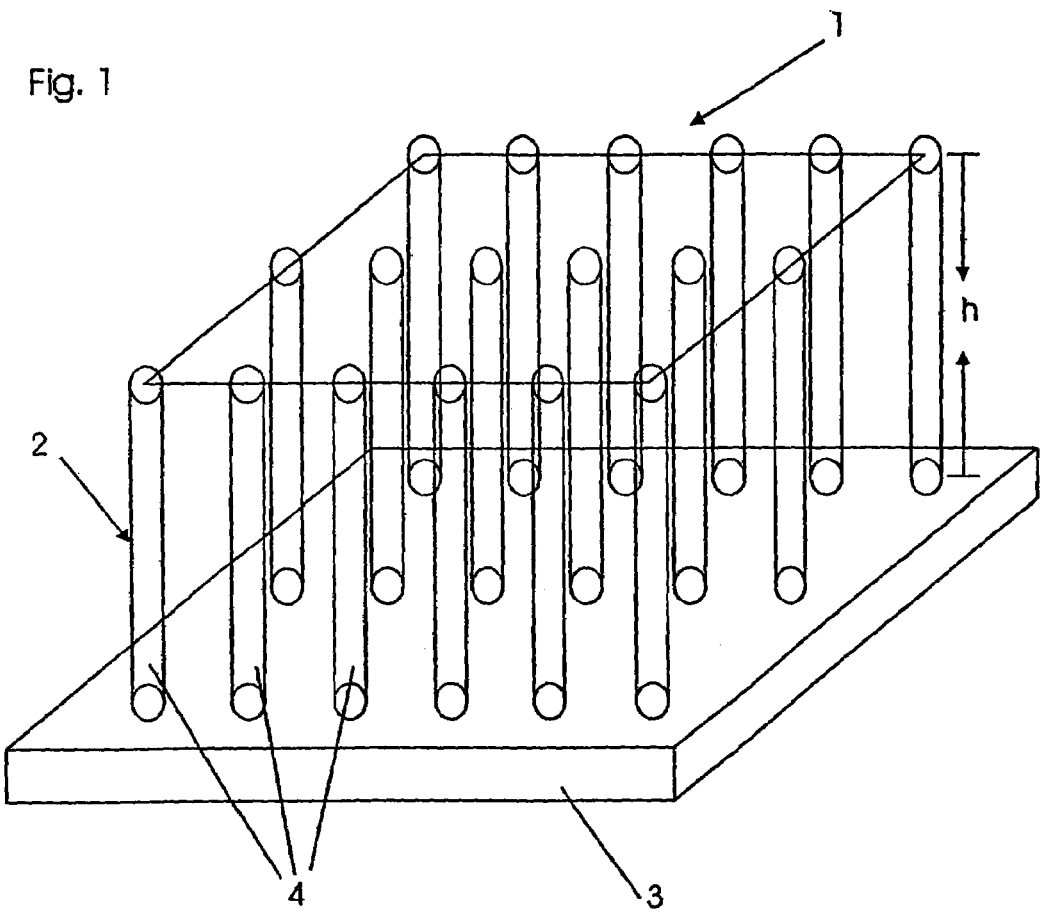
FIG. 1 shows a schematic perspective illustration of a detail of an embodiment of the photonic crystal according to the present invention.

FIG. 1 shows photonic crystal 1 according to the present invention which was produced using additive lithography, including the electron beam-induced deposition of a three-dimensional structure 2 on a substrate 3. For the production, a beam current of 100 pA to 200 pA was used.

Three-dimensional structure 2 is arranged on substrate 3 and adheres thereto. The deposited material is a composition of essentially spherical, metallic nano-crystals in a matrix of insulating amorphous carbon or polymer, grown from $CH_x$ radicals. For example, platinum and/or gold are used as metals.

The exemplary three-dimensional structure 2 includes a multiplicity of essentially cylindrical micro-columns or rods 4 of $Me_2Au$ arranged in a two-dimensional, evenly spaced matrix. The energy band gap is 1.38 eV, which corresponds to a photon wavelength of 900 nm. Length h of the rods is about 2000 nm. Structure 2 is, respectively rods 4 are, nanocrystalline or amorphous.

Figure 2:
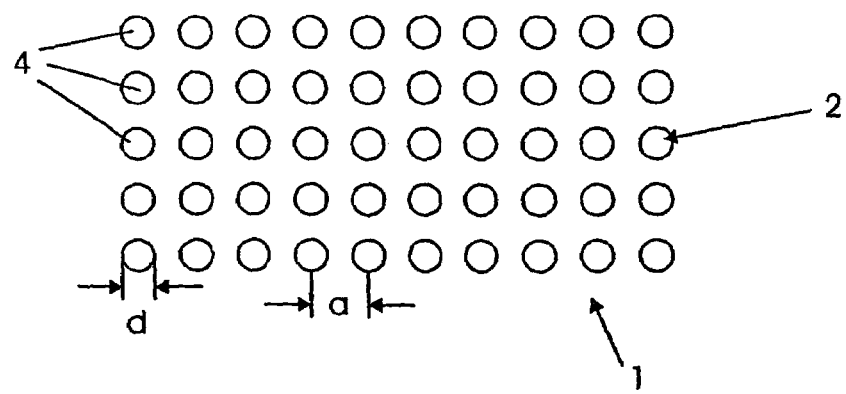
FIG. 2 shows a plan view of a detail of the photonic crystal according to FIG. 1.

With reference to FIG. 2, diameter d of rods 4 is about 140 nm and pitch a of rods 4 within the evenly spaced matrix-shaped array in the horizontal and vertical direction is, in each instance, 320 nm from the center to center of adjacent rods 4.

Variations in the dimensions, e.g., a diameter of the rods within the range of 80 nm to 300 nm, are likewise producible and/or usable. Likewise, other forms are producible and/or usable as cylindrical rods.

Alternative methods for manufacturing the photonic crystals include, but are not limited to: chemically assisted ion-beam etching; X-ray lithography and forming; optical lithographic bonding (so-called on-top bonding); three-dimensional laser deposition or electron-beam nano-lithography.

Embodiments of the present invention may use a substrate, in particular, a glass ceramic, which includes or is made of micro-crystals of an average size within the range of about 50 nm. However, micro-crystal sizes other than those mentioned, e.g., smaller or larger than 50 nm, are likewise usable within the framework of the present invention.

Embodiments of the present invention may use a substrate 2 which, chemically, mechanically, and/or in terms of polishing characteristics, is substantially similar or even identical to the fused quartz. Substrate 2 may have a smooth, e.g., polished surface, which is especially beneficial when combined with the three-dimensional structures of the photonic crystal according to the present invention.

What is claimed is:
1. A photonic crystal, comprising:
    a substrate having a substrate thermal expansion coefficient, wherein within the temperature range of −60° C. and 85° C., a magnitude of the substrate thermal expansion coefficient is at most half as great as a magnitude of a thermal expansion coefficient of fused quartz, wherein the substrate includes glass ceramic the substrate thermal expansion coefficient being less than $5 \times 10^{-7}$/° C. within the temperature range of −60° C. and 85° C., and wherein the glass ceramic has a glass phase and a crystalline phase distributed therein, and has a glass ceramic thermal expansion coefficient of less than a thermal expansion coefficient of the glass phase within the temperature range of −60° C. and 85° C.

2. The photonic crystal as recited in claim 1, wherein a thermal expansion coefficient of the crystalline phase is negative, at least in parts of the temperature range of −60° C. and 85° C.

3. The photonic crystal as recited in claim 2, wherein a weight proportion of the crystalline phase in the glass ceramic is between 60% and 90%.

4. The photonic crystal as recited in claim 2, wherein a weight proportion of the crystalline phase in the glass ceramic is between 70% and 80%.

5. A photonic crystal, comprising:
a substrate having a substrate thermal expansion coefficient,
wherein within the temperature range of −60° C. and 85° C., a magnitude of the substrate thermal expansion coefficient is at most half as great as a magnitude of a thermal expansion coefficient of fused quartz wherein the crystalline phase is distributed homogeneously in the glass ceramic.

6. A method for manufacturing photonic crystals, comprising:
providing a glass ceramic substrate for a crystal,
wherein the glass ceramic substrate has a thermal expansion coefficient of less than $10^{-7}$/° C. within a temperature range of −60° C. and 85° C., and wherein the glass ceramic substrate has a glass phase and a crystalline phase distributed therein, the glass ceramic substrate thermal expansion coefficient being less than a thermal expansion coefficient of the glass phase.

7. The method as recited in claim 6, wherein a thermal expansion coefficient of the crystalline phase is negative.

8. The method as recited in claim 7, wherein a weight proportion of the crystalline phase in the glass ceramic substrate is between 60% and 90%.

9. The method as recited in claim 8, wherein a weight proportion of the crystalline phase in the glass ceramic substrate is between 70% and 80%.

10. A method for manufacturing photonic crystals, comprising:
providing a glass ceramic substrate for a crystal,
wherein the glass ceramic substrate has a thermal expansion coefficient of less than $10^{-7}$/° C. within a temperature range of −60° C. and 85° C., and wherein the crystalline phase is distributed homogeneously in the glass ceramic substrate.

* * * * *